United States Patent
Yao et al.

(10) Patent No.: US 6,777,720 B2
(45) Date of Patent: Aug. 17, 2004

(54) SEMICONDUCTOR LIGHT-EMITTING ELEMENT HAVING FIRST AND SECOND EPITAXIAL LAYER GROUP II-VI SEMICONDUCTOR COMPOUNDS ON A SUBSTRATE

(75) Inventors: Takafumi Yao, 1-1, Katahira 2-Chome, Aoba-Ku, Sendai City, Miyagi Prefecture (JP); Hiromitsu Uchiyama, Nagoya (JP); Takaharu Iwadachi, Nagoya (JP)

(73) Assignees: NGK Insulators, Ltd., Nagoya (JP); Takafumi Yao, Sendai (JP)

( * ) Notice: Subject to any disclaimer, the term of this patent is extended or adjusted under 35 U.S.C. 154(b) by 0 days.

(21) Appl. No.: 10/051,614

(22) Filed: Jan. 18, 2002

(65) Prior Publication Data

US 2002/0134989 A1 Sep. 26, 2002

(30) Foreign Application Priority Data

Jan. 19, 2001 (JP) ........................................ 2001-012254

(51) Int. Cl.[7] .............................................. H01L 29/18
(52) U.S. Cl. .......................................... 257/103; 257/88
(58) Field of Search .............................. 257/78, 88, 89, 257/90, 103; 372/43–46

(56) References Cited

U.S. PATENT DOCUMENTS 3,916,510 A * 11/1975 Martin ........................ 438/33

FOREIGN PATENT DOCUMENTS

| EP | 977278 A2 * | 2/2000 | .......... 257/E33.061 |
|---|---|---|---|
| JP | 8-293625 | 11/1996 | |
| JP | 9-232627 | 9/1997 | |
| JP | 10-022527 | 1/1998 | |
| JP | 10-027946 | 1/1998 | |
| JP | 10-163535 | 6/1998 | |
| JP | 11-135838 | 5/1999 | |
| JP | 2000-49374 | 2/2000 | |

OTHER PUBLICATIONS

Academic Press Dictionary of Science and Technology, Christopher Morris (ed), 1992, Academic Press, Inc. 1250 Sixth Avenue, San Diego, California 92101–1311, p. 2388.*

"Optic Functional Material's Manual" Optronics Ltd., Jun. 1997, p. 457–459.

* cited by examiner

Primary Examiner—Minhloan Tran
Assistant Examiner—Thomas L. Dickey
(74) Attorney, Agent, or Firm—Burr & Brown

(57) ABSTRACT

A first epitaxial layer group to emit a yellow color light is provided on a substrate via a first buffer layer. Then, a second epitaxial layer group to emit a blue color light is provided on the first epitaxial layer group via a second buffer layer. The first and the second epitaxial layer group are made of II–VI semiconductor compounds, respectively.

9 Claims, 5 Drawing Sheets

SEMICONDUCTOR LIGHT-EMITTING ELEMENT HAVING FIRST AND SECOND EPITAXIAL LAYER GROUP II-VI SEMICONDUCTOR COMPOUNDS ON A SUBSTRATE

This application claims priority from Japanese Application 2001-012,254, filed Jan. 19, 2001, the entirety of which is incorporated herein by reference.

BACKGROUND OF THE INVENTION

1. Field of the Invention

This invention relates to a semiconductor light-emitting element, particularly a multilayered light-emitting element to generate and emit a white color light which is composed of plural epitaxial layers grown on a substrate.

2. Related Art Statement

Recently, an attention is paid to a blue color light-emitting element made of III–V semiconductor compounds or II–VI semiconductor compounds, and in reality, a GaN-based semiconductor light-emitting element and a ZnSe-based semiconductor light-emitting element are developed as such a blue color light-emitting element. In addition, a white color light-emitting element is also proposed by taking advantage of the blue color light-emitting element.

For example, in "Optic Functional Material's Manual", p457, June, 1997, published by Optronics Ltd., such a white color light-emitting element as composed of a GaInN-based LED including a sapphire single crystal and an active layer made of GaInN and a YAG fluorescent substance is disclosed.

Moreover, in Japanese Laid-open Patent Publication Kokai Hei 2000-49374 (JP A 2000-49374), such a white color light-emitting element as to generate and emit a white color light by superimposing a blue color light or a blue-green color light emitted from a GaInN-based active layer and a yellow color light from the fluorescent color center of a GaN substrate which is excited by the blue color light or the blue-green color light, is disclosed.

In this manner, various white color light-emitting elements using GaN-based blue color light-emitting elements are proposed, but white color light-emitting elements using ZnSe-based blue color light-emitting elements are scarcely proposed, and thus, strongly desired.

SUMMARY OF THE INVENTION

It is an object of the present invention to provide a new white color light-emitting element made of II–VI semiconductor compounds such as ZnSe-based semiconductor compounds.

For achieving the above object, this invention relates to a semiconductor light-emitting element comprising:

a substrate, a first epitaxial layer group to emit a yellow color light which is provided on the substrate and made of II–VI semiconductor compounds, and a second epitaxial layer group to emit a blue color light which is provided on the substrate and made of II–VI semiconductor compounds.

As mentioned above, in the present invention, on a substrate are provided and stacked a first epitaxial layer group and a second epitaxial layer group which are made of II–VI semiconductor compounds. Then, a yellow color light is generated and emitted from the first epitaxial layer group and a blue color light is generated and emitted from the second epitaxial layer group. Therefore, by superimposing the yellow color light and the blue color light, a given white color light can be obtained from the semiconductor light-emitting element entirely.

In this case, by controlling the chromaticities and the intensities of the yellow color light and the blue color light independently, various white color lights such as a warm white color light or a cold white color light can be obtained. Moreover, the brightness of the thus obtained white color light is not reduced by the combination of the yellow color light and the blue color light. As a result, a much brighter white color light can be obtained in the semiconductor light-emitting element than in a conventional one.

BRIEF DESCRIPTION OF THE DRAWINGS

For better understanding of the present invention, reference is made to the attached drawings, wherein.

DETAILED DESCRIPTION OF THE INVENTION

This invention will be described in detail with reference to the accompanying drawings.

Figure 1:
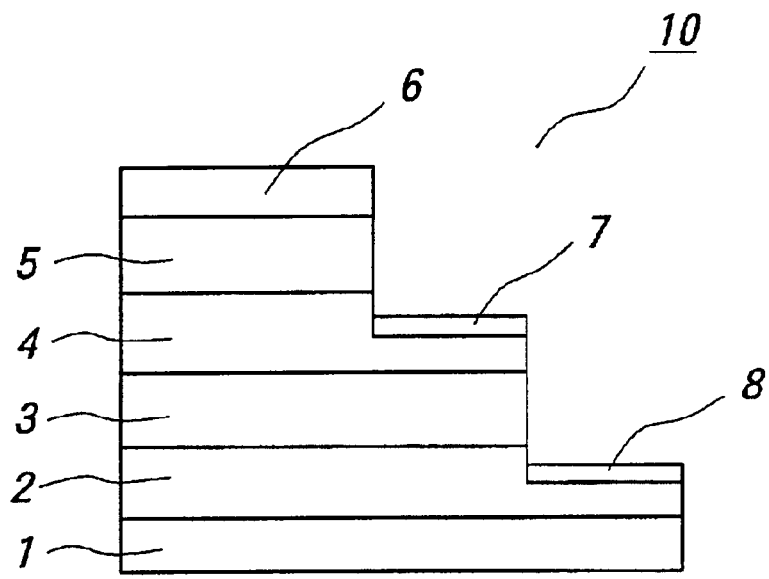
FIG. 1 is a structural view showing a semiconductor light-emitting element according to the present invention.
Figure 2:
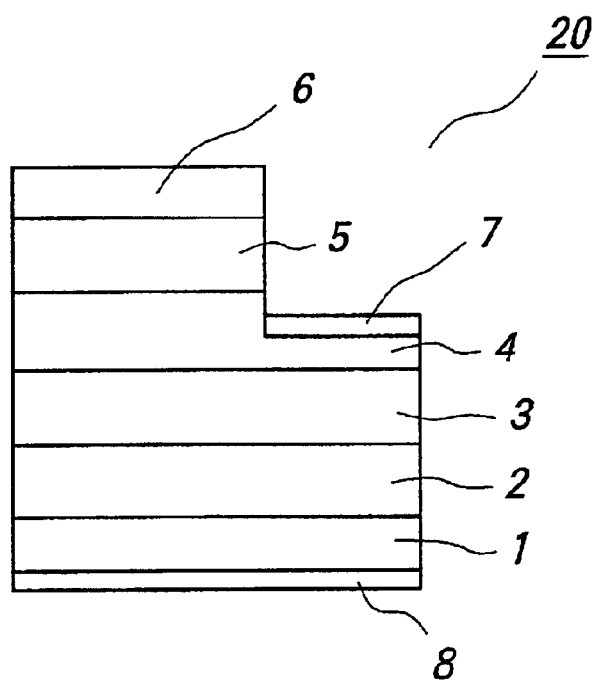
FIG. 2 is a structural view showing another semiconductor light-emitting element according to the present invention.

FIG. 1 is a structural view showing a semiconductor light-emitting element according to the present invention, and FIG. 2 is a structural view showing another semiconductor light-emitting element according to the present invention.

FIGS. 1 and 2 show semiconductor light-emitting elements 10 and 20, each of which include substrate 1, first epitaxial layer group 3 as yellow color light-emitting elements via first buffer layer 2, and second epitaxial layer group 5 as blue color light-emitting elements via second buffer layers 4.

On the second epitaxial layer group 5 is provided a p-type contact electrode device 6 and on the exposed surfaces of the second buffer layer 4 is provided a p-type electrode 7. In addition, in the semiconductor light-emitting element 10, on the exposed surface of the first buffer layer 2 is provided an n-type electrode 8, and in the semiconductor light-emitting element 20, on the backside surface of the substrate 1 is provided another n-type electrode 8.

In either case, by applying a given voltage between the p-type contact electrode device 6; the p-type electrode 7 and the n-type electrode 8 to flow an electric current through the first epitaxial layer group 3 and the second epitaxial layer group 5, the first epitaxial layer group 3 and the second epitaxial layer group 5 are excited and generate and emit a yellow color light and a blue color light, respectively. In the semiconductor light-emitting element 10 or 20, the yellow color light and the blue color light are superimposed and thus, a given white color light is generated and emitted.

The yellow color light and the blue color light are generated and emitted from the first epitaxial layer group 3 and the second epitaxial layer group 5, independently. Therefore, by controlling the chromaticities and the intensities of the yellow color light and the blue color light independently, various white color lights such as a warm white color light or a cold white color light can be obtained. Moreover, the brightness of the thus obtained white color light is not reduced by the combination of the yellow color light and the blue color light. As a result, a much brighter white color light can be obtained in the semiconductor light-emitting element than in a conventional one.

Figure 3:
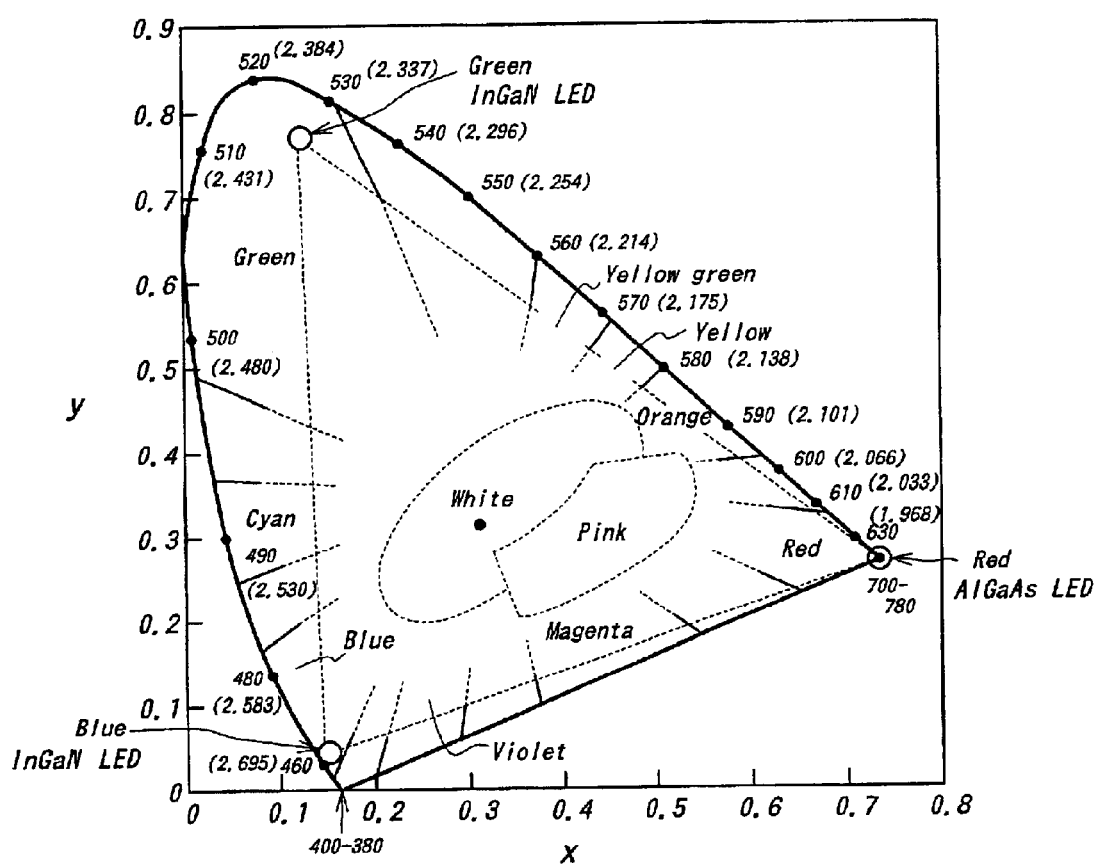
FIG. 3 is a graph showing the relation between the chromaticity and the bandgap in a II–VI semiconductor compound.
Figure 4:
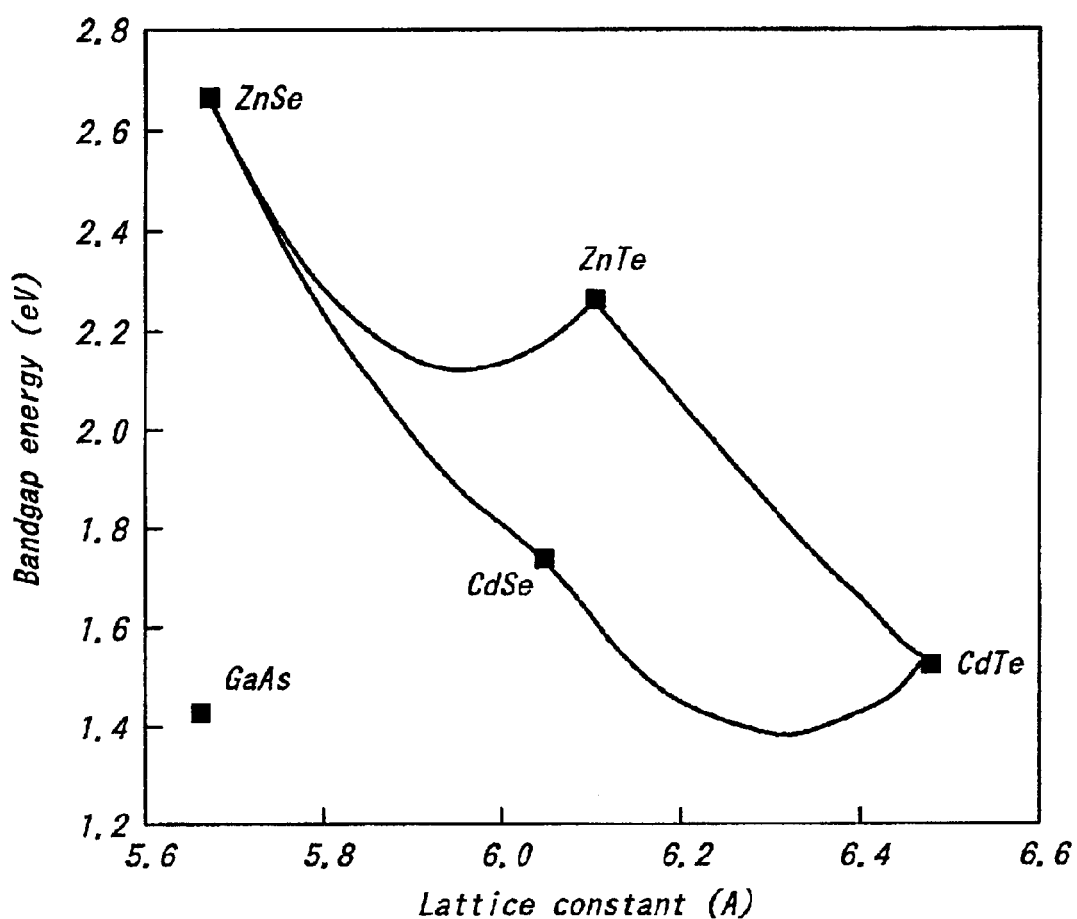
FIG. 4 is a graph showing the relation between the lattice constant and the bandgap in a II–VI semiconductor compound.
Figure 5:
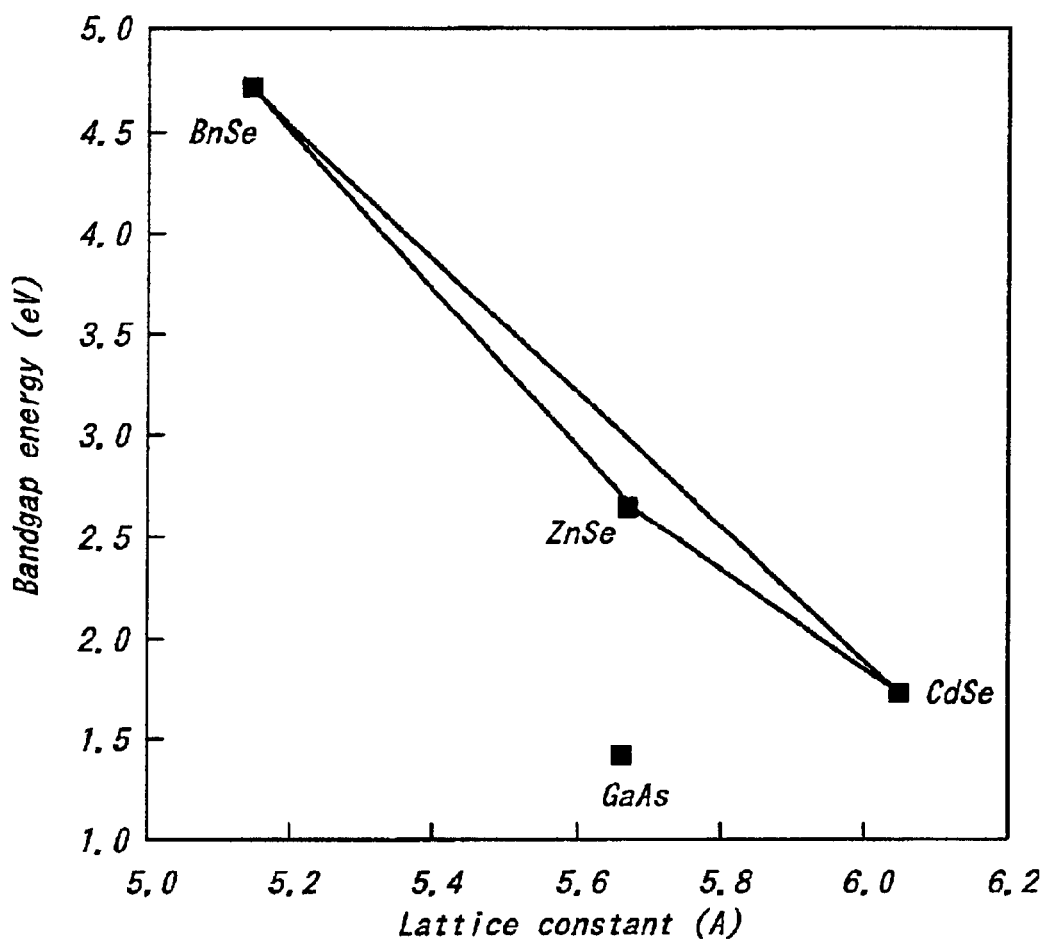
FIG. 5 is another graph showing the relation between the lattice constant and the bandgap in a II–VI semiconductor compound.

FIG. 3 is a graph showing the relation between the chromaticity and the bandgap in a II–VI semiconductor compound, and FIGS. 4 and 5 are graphs showing the relation between the lattice constant and the bandgap in a II–VI semiconductor compound, respectively.

In order to obtain a white color light from the combination of the yellow color light and the blue color light, the inventors investigated the constructions of the first epitaxial layer group 3 and the second epitaxial layer group 5 on the basis of the graphs shown in FIGS. 3–5.

Figure 6:
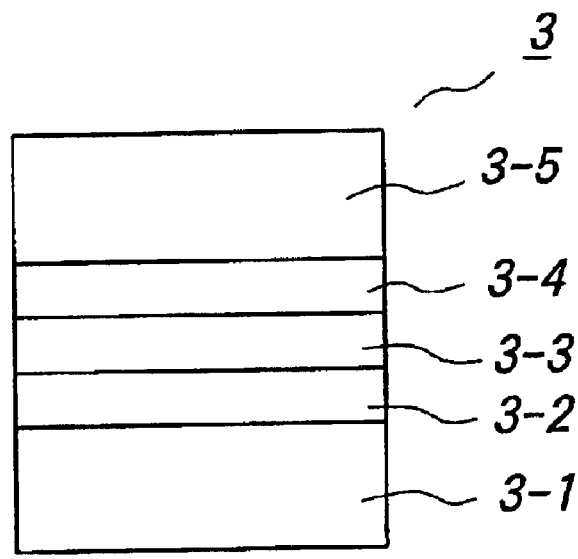
FIG. 6 is a structural view showing a first epitaxial layer group.

FIG. 6 is a structural view showing a first epitaxial layer group. In FIG. 6, the first epitaxial layer group 3 includes an n-type cladding layer 3-1, an n-type optical waveguide layer 3-2 provided on the n-type cladding layer 3-1, and a light-emitting active layer 3-3 provided on the n-type optical waveguide layer 3-2. Moreover, the first epitaxial layer group 3 includes a p-type optical waveguide layer 3-4 provided on the light-emitting active layer 3-3 and a p-type cladding layer 3-5 provided on the p-type optical waveguide layer 3-4.

Electrons and positive holes are injected into the light-emitting active layer 3-3 from the n-type optical waveguide layer 3-2 and the p-type optical waveguide layer 3-4, respectively, and are combined, to emit a given color light.

The n-type cladding layer 3-1 and the p-type cladding layer 3-5 function as barrier layers for the light-emitting active layer 3-3.

In view of FIGS. 3–5, it is desired that the light-emitting active layer 3-3 is made of a II–VI semiconductor compound including Zn, Se, Te and Cd, particularly having a composition of $Zn_{1-X}Cd_XSe_{1-Y}Te_Y$ (0.1<X<0.4, 0.1<Y<0.4). In this case since the $Zn_{1-X}Cd_XSe_{1-Y}Te_Y$ semiconductor material has a bandgap energy within 2.132–2.172 eV, it can generate and emit a yellow to yellow green color light stably if it is excited.

The n-type cladding layer 3-1, the p-type cladding layer 3-5, the n-type optical waveguide layer 3-2 and the p-type optical waveguide layer 3-4 are made of normal II–VI semiconductor compounds, respectively. In the case of the light-emitting active layer 3-3 being made of the above-mentioned semiconductor material, it is desired that the n-type cladding layer 3-1 through the p-type optical waveguide layer 3-4 are made of II–VI semiconductor compounds including Be and Mg, particularly having a composition of (BeMgZn)Se.

Figure 7:
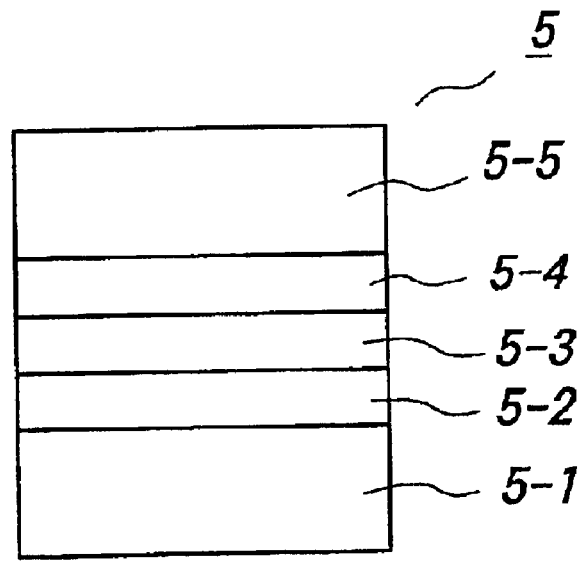
FIG. 7 is a structural view showing a second epitaxial layer group.

FIG. 7 is a structural view showing a second epitaxial layer group. In FIG. 7, a second epitaxial layer group 5 includes an n-type cladding layer 5-1, an n-type optical waveguide layer 5-2 provided on the n-type cladding layer 5-1 and a light-emitting active layer 5-3 provided on the n-type optical waveguide layer 5-2. Moreover, the second epitaxial layer group 5 includes a p-type optical waveguide layer 5-4 provided on the light-emitting active layer 5-3 and a p-type cladding layer 5-5 provided on the p-type optical waveguide layer 5-4.

Electrons and positive holes are injected into the light-emitting active layer 5-3 from the n-type optical waveguide layer 5-2 and the p-type optical waveguide layer 5-4, respectively, and are combined, to emit a given color light from the light-emitting active layer 5-3.

The n-type cladding layer 5-1 and the p-type cladding layer 5-5 function as barrier layers for the light-emitting active layer 5-3.

In view of FIGS. 3 and 5, the light-emitting active layer 5-3 is made of a II–VI semiconductor compound including Zn, Cd, Se and Be. Moreover, in view of FIGS. 3 and 4, the light-emitting active layer 5-3 may be made of a II–VI semiconductor compound including Zn, Se, Te and Cd, particularly having a composition of $Zn_{1-Z}Cd_ZSe_{1-V}Te_V$ (0<Z<0.1, 0<V<0.1). In this case, since the $Zn_{1-Z}Cd_ZSe_{1-V}Te_V$ semiconductor material has a bandgap energy within 2.528–2.675 eV, it can generate and emit a blue green to blue color light stably if it is excited.

The n-type cladding layer 5-1, the p-type cladding layer 5-5, the n-type optical waveguide layer 5-2 and the p-type optical waveguide layer 5-4 are made of normal II–VI semiconductor compounds, respectively. In the case of the light-emitting active layer 5-3 being made of the above-mentioned semiconductor material, it is desired that the n-type cladding layer 5-1 through the p-type optical waveguide layer 54 are made of II–VI semiconductor compounds including Be and Mg, particularly having a composition of (BeMgZn)Se.

In the first and the second epitaxial layer groups 3 and 5, the light-emitting active layers 3-3 and 5-3 may be made of single layers or quantum dots, respectively. If the light-emitting active layers 3-3 and 5-3 are made such quantum dots, the mismatches in lattice constant of the layers 3-3 and 5-3 can be mitigated.

If the first buffer layer 2 and the second buffer layer 4 are made of ZnSe semiconductors, the mismatches in lattice constant between the semiconductor layers constituting the semiconductor light-emitting elements 10 and 20 as shown in FIGS. 1 and 2 can be mitigated.

In the semiconductor light-emitting elements 10 and 20, the p-type contact electrode device 6 may be made of a p-type BeTe contact layer/p-type ZnSe cap layer/p-type layer electrode.

The p-type electrodes 7 and the n-type electrodes 8 may be made of normal electrode materials, respectively.

The substrates 1 may be made of normal substrate materials available by persons skilled in the art, particularly made of a GaAs substrate or a InP substrate.

Although the present invention was described in detail with reference to the above examples, this invention is not limited to the above disclosure and every kind of variation and modification may be made without departing from the scope of the present invention.

For example, in the semiconductor light-emitting elements 10 and 20 as shown in FIGS. 1 and 2, the first epitixial layer group 3 as a yellow light-emitting element is provided on the downside, and the second epitaxial layer group 5 as a blue light-emitting element is provided on the upside.

However, it is possible to arrange the epitaxial layer groups the other way around.

In the first epitaxial layer group 3 and the second epitaxial layer group 5 as shown in FIGS. 5 and 6, the lower semiconductor layers from the light-emitting active layers 3-3 and 5-3 are made of n-type semiconductor compounds, and the upper semiconductor layers from the light-emitting active layers 3-3 and 5-3 are made of p-type semiconductor compounds. However, it is also possible to arrange those layers the other way around.

As mentioned above, the semiconductor light-emitting element of the present invention has, on a given substrate, the first epitaxial layer group to emit a yellow color light and the second epitaxial layer group to emit a blue color light which are made of II–VI semiconductor compounds. Therefore, the semiconductor light-emitting element can generate and emit various white color lights such as a warm white color light or a cold white color light can be obtained. Moreover, the brightness of the thus obtained white color light is not reduced by the combination of the yellow color light and the blue color light. As a result, a much brighter white color light can be obtained in the semiconductor light-emitting element than in a conventional one.

What is claimed is:

1. A semiconductor light-emitting element comprising:
   a substrate,
   a first epitaxial layer group to emit a yellow color light provided on the substrate and made of II–VI semiconductor compounds, said first epitaxial layer group including an active layer, and
   a second epitaxial layer group to emit a blue color light provided on the substrate and made of II–VI semiconductor compounds.

2. A semiconductor light-emitting element as defined in claim 1, wherein the first epitaxial layer group includes a light-emitting active layer made of a II–VI semiconductor compound containing Zn, Se, Te and Cd.

3. A semiconductor light-emitting element as defined in claim 2, wherein the light-emitting active layer is made of a II–VI semiconductor compound having a composition of $Zn_{1-X}Cd_XSe_{1-Y}Te_Y$ (0.1<X<0.4, 0.1Y<0.4).

4. A semiconductor light-emitting element as defined in claim 2, wherein the fire epitaxial layer group includes a first optical waveguide layer and a second optical waveguide layer which sandwich the light-emitting active layer and are made of II–VI semiconductor compounds containing Be and Mg, respectively.

5. A semiconductor light-emitting element as defined in claim 4, wherein the first epitaxial layer group includes a first cladding layer and a second cladding layer which sandwich the first optical waveguide layer and the second optical waveguide layer on the outside of the first and the second optical waveguide layers, and are made of II–VI semiconductor compounds containing Be and Mg, respectively.

6. A semiconductor light-emitting element as defined in claim 1, wherein the second epitaxial layer group includes a light-emitting active layer made of a II–VI semiconductor compound containing Zn, Se, Te and Cd.

7. A semiconductor light-emitting element as defined in claim 6, wherein the light emitting active layer is made of a II–VI semiconductor compound having a composition of $Zn_{1-Z}Cd_ZSe_{1-V}Te_V$ (0.1<Z<0.1, 0V<0.1).

8. A semiconductor light-emitting element as defined in claim 6, wherein the second epitaxial layer group includes a first optical waveguide layer and a second optical waveguide layer which sandwich the light-emitting active layer are made of II–VI semiconductor compounds containing Be and Mg, respectively.

9. A semiconductor light-emitting element as defined in claim 8, wherein the second epitaxial layer group includes a first cladding layer and a second cladding layer which sandwich the first optical waveguide layer and the second optical waveguide layer on the outside of the first and the second optical waveguide layers, and are made of II–VI semiconductor compounds containing Be, and Mg, respectively.

* * * * *

UNITED STATES PATENT AND TRADEMARK OFFICE
CERTIFICATE OF CORRECTION

PATENT NO. : 6,777,720 B2
DATED : August 17, 2004
INVENTOR(S) : Takafumi Yao, Hiromitsu Uchiyama and Takaharu Iwadachi It is certified that error appears in the above-identified patent and that said Letters Patent is hereby corrected as shown below:

Title page,
Item [75], Inventors, change "Hiromitsu Uchiyama, Nagoya (JP)" to -- Hiromitsu Uchiyama, Sendai (JP) --; and change "Takaharu Iwadachi, Nagoya (JP)" to -- Takaharu Iwadachi, Handa (JP) --
Item [57], ABSTRACT,
Line 2, replace "Then, a" with -- A --
Line 5, change "group" to -- groups --

Column 6,
Line 24, change "(0.1<Z<0.1, 0V,0.1)" to -- (0<Z<0.1, 0<V<0.1) --
Line 28, add -- and -- after the second occurrence of "layer"
Line 37, delete "," after "Be"

Signed and Sealed this

Eighth Day of February, 2005

JON W. DUDAS
*Director of the United States Patent and Trademark Office*